(12) United States Patent
Tamaki

(10) Patent No.: US 7,704,891 B2
(45) Date of Patent: Apr. 27, 2010

(54) METHOD OF PRODUCING SEMICONDUCTOR DEVICE

(75) Inventor: Sadaharu Tamaki, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 216 days.

(21) Appl. No.: 12/078,086

(22) Filed: Mar. 27, 2008

(65) Prior Publication Data

US 2008/0261391 A1    Oct. 23, 2008

(30) Foreign Application Priority Data

Apr. 20, 2007    (JP) ............................ 2007-111524

(51) Int. Cl.
*H01L 21/461* (2006.01)

(52) U.S. Cl. ........................ 438/738; 438/669; 438/736; 438/E23.142

(58) Field of Classification Search ......... 438/669–671, 438/711, 736–738

See application file for complete search history.

(56) References Cited

U.S. PATENT DOCUMENTS

2002/0016071 A1* 2/2002 Hsia et al. .................. 438/689

FOREIGN PATENT DOCUMENTS

JP          06-275625          9/1994

\* cited by examiner

*Primary Examiner*—Dung A. Le
(74) *Attorney, Agent, or Firm*—Kubotera & Associates, LLC

(57) ABSTRACT

A method of producing a semiconductor device includes the steps of: preparing a base member; laminating sequentially a barrier film formed of titanium nitride, a wiring portion film formed of tungsten, and a mask film formed of titanium nitride on the base member to form a multi-layer film; forming a resist mask on the mask film so that the resist mask covers a wiring portion forming area and exposes a wiring portion non-forming area; etching the mask film using a first gas in which titanium nitride has a large etching ratio with respect to tungsten; and etching the wiring portion film using a second gas in which tungsten has a large etching ratio with respect to titanium nitride so that a portion of the wiring portion film in the wiring portion non-forming area is removed and a portion of the wiring portion film in the wiring portion forming area remains.

15 Claims, 13 Drawing Sheets

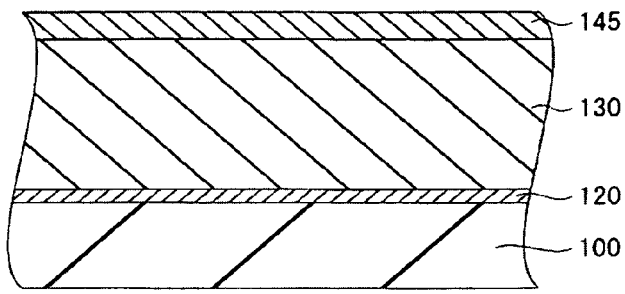
Fig. 11 (A) Prior Art
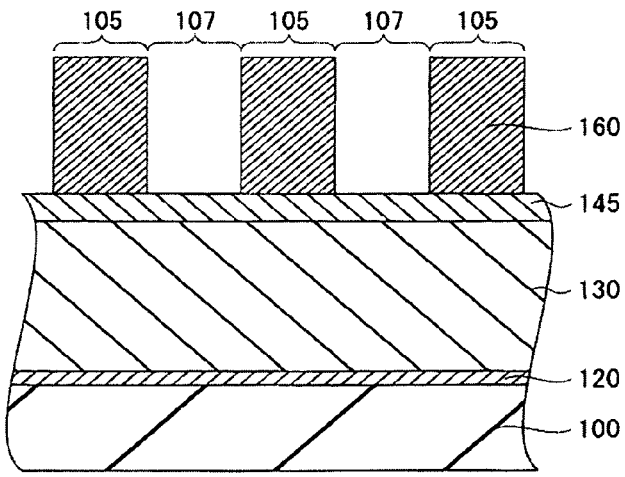
Fig. 11 (B) Prior Art
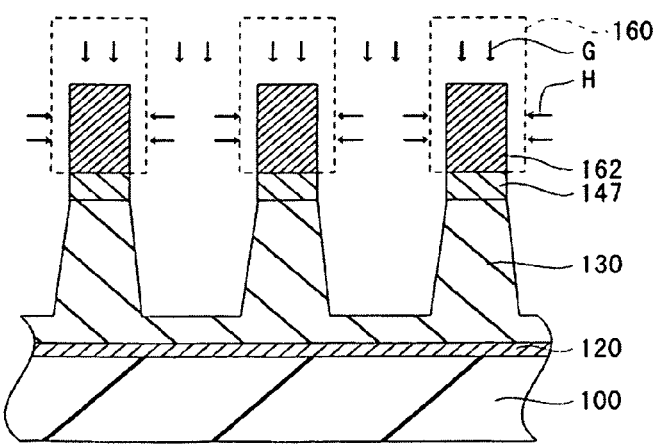
Fig. 11 (C) Prior Art

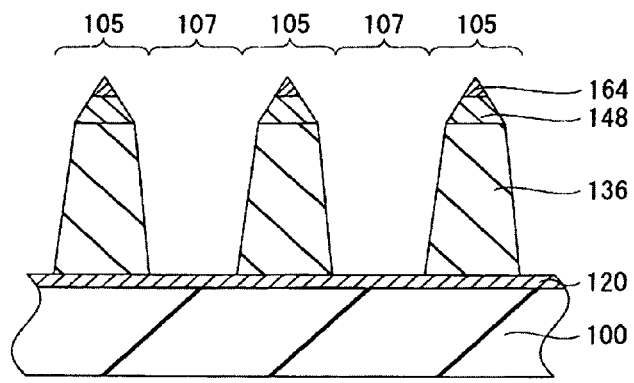
Fig. 12 (A) Prior Art
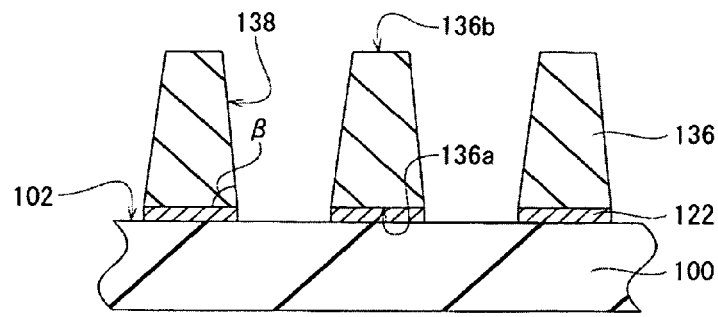
Fig. 12 (B) Prior Art
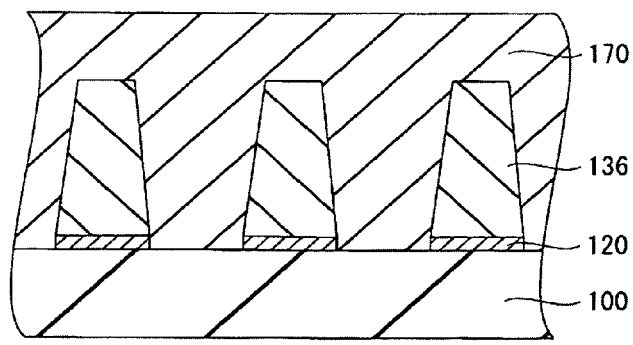
Fig. 12 (C) Prior Art

METHOD OF PRODUCING SEMICONDUCTOR DEVICE

BACKGROUND OF THE INVENTION AND RELATED ART STATEMENT

The present invention relates to a method of producing a semiconductor device. In particular, the present invention relates to a method of forming a wiring portion containing a high melting temperature metal.

When a wiring portion is formed of a high melting temperature metal, as compared with a wiring portion containing an aluminum alloy, it is possible to prevent a life of the wiring portion from being shortened due to electro-migration and reduce a cost thereof. Accordingly, it is preferred to use a wiring portion formed of a high melting temperature metal in a semiconductor device.

A conventional method of producing a semiconductor device will be explained with reference to FIGS. 11(A)-11(C) to 13(A)-13(B) (refer to Patent Reference).

Patent Reference Japanese Patent Publication No. 06-275625

FIGS. 11(A) to 11(C) are schematic sectional views showing the conventional method of producing the semiconductor device. FIGS. 12(A) to 12(C) are schematic sectional views showing the conventional method of producing the semiconductor device. FIGS. 13(A) and 13(B) are schematic sectional views showing the conventional method of producing the semiconductor device.

First, a base member 100 is prepared. The base member 100 is formed of a semiconductor substrate having an element such as a transistor formed thereon and an interlayer insulation film formed on the semiconductor substrate. A conductive plug is formed in the interlayer insulation film for electrically connecting the element formed in the semiconductor substrate to a wiring portion formed in a later step.

In the next step, a titanium nitride film is formed on the base member 100 with a sputter method. The titanium nitride film is referred to as a barrier film 120. Then, tungsten is deposited on the barrier film 120 with a CVD method to form a wiring portion film 130. Afterward, as shown in FIG. 11(A), a silicon nitride film 145 is formed on the wiring portion film 130 with a CVD method.

In the next step, as shown in FIG. 11(B), a resist is coated on the silicon nitride film 145 to form a resist film. The resist film is patterned through photolithography to form resist masks 160. The resist masks 160 cover wiring portion forming areas 105 such that wiring portion non-forming areas 107 are exposed.

In the next step, as shown in FIG. 11(C), the silicon nitride film 145 and the wiring portion film 130 are patterned using the resist masks 160 through RIE (Reactive Ion Etching). A $SF_6$ gas is used as an etching gas.

An etching ratio of tungsten with respect to the resist is about 2.0. Accordingly, when the wiring portion film 130 is formed of a tungsten film, the resist masks 160 are etched in a vertical direction upon etching tungsten. As described later, the resist masks 160 have poor plasma resistance, so that the resist masks 160 are etched in a horizontal direction as well. In FIG. 11(C), there are shown etching remaining portions 162 of the resist masks 160 and etching remaining portions 147 of the silicon nitride film 145.

Further, when the $SF_6$ gas is used as an etching gas, tungsten has a large etching ratio with respect to titanium nitride. Accordingly, as shown in FIG. 12(A), when the wiring portion film 130 is etched, the wiring portion film 130 in the wiring portion non-forming areas 107 is removed, and the wiring portion film 130 stops being etched when the barrier film 120 is exposed. That is, the barrier film 120 functions as an etching stopper.

Remaining portions of the wiring portion film 130 after the RIE are referred to as tungsten wiring portions 136 or wiring portions 136. Further, in FIG. 12(A), there are shown etching remaining portions 164 of the resist mask 160 and etching remaining portions 148 of the silicon nitride film 145.

In the next step, the RIE is performed using a $Cl_2$ gas as an etching gas, so that portions of the barrier film 120 in the wiring portion non-forming areas 107 are removed, and etching remaining portions 122 of the barrier film 120 remain in the wiring portion forming areas 105. In the RIE using the $Cl_2$ gas as an etching gas, tungsten has a large etching ratio with respect to titanium nitride. Accordingly, as shown in FIG. 12(B), when the barrier film 120 is etched, the tungsten wiring portions 136 are not etched to a large extent.

In the next step, as shown in FIG. 12(C), an NSG (Non-doped Silicate Glass) is deposited on the base member 100 with a CVD method to form an interlayer insulation film 170 embedding the wiring portions 136.

In the next step, as shown in FIG. 13(A), through holes 171 are formed in the interlayer insulation film 170 on the wiring portions 136 through photolithography and dry etching.

In the next step, as shown in FIG. 13(B), a titanium nitride film 182 and a metal film 184 are sequentially formed with a CVD method and a puttering method, so that the through holes 171 are filled with the titanium nitride film 182 and the metal film 184. The titanium nitride film 182 and the metal film 184 filling the through holes 171 are referred to as an upper layer metal wiring portion 180. The upper layer metal wiring portion 180 is electrically connected to the tungsten wiring portions 136 or lower layer wiring portions.

In the conventional method of producing the semiconductor device described above, the tungsten wiring portions 136 or lower layer wiring portions have a section with a forward tapered shape, in which a width of a bottom portion 136a on a base member side (lower side) becomes larger than a width of a top portion 136b on a resist mask side (upper side). The forward tapered shape is formed for the following reason.

When a fine wiring portion such as the wiring portions 136 having a width less than 150 nm is formed, a KrF excimer laser or an ArF excimer laser is used as a stepper. A KrF type resist or an ArF type resist used in this process has poor plasma resistance. Accordingly, during the RIE, a resist mask is etched not only in a vertical direction (an arrow direction G in FIG. 11(C)) but also a horizontal direction (an arrow direction H in FIG. 11(C)).

Accordingly, when the wiring film 136 formed of tungsten is etched, a width of the resist mask 160 decreases in the horizontal direction. When the wiring film 136 formed of tungsten is further etched, the width of the resist mask 160 gradually decreases. As a result, as shown in FIG. 12(B), the tungsten wiring portions 136 have the section with the forward tapered shape, in which a side surface 138 of the tungsten wiring portion 136 is inclined by an angle β of 80 degrees with respect to an upper surface 102 of the base member 100.

When the tungsten wiring portions 136 have the section with the forward tapered shape, a sectional area of the tungsten wiring portions 136 decreases by an amount proportional to the decrease in the width of the top portions 136b of the tungsten wiring portions 136 on the resist mask side. Due to the decrease in the sectional area, a wiring resistance of the tungsten wiring portions 136 increases, thereby deteriorating a performance of the semiconductor device.

Further, when the tungsten wiring portions 136 have the section with the forward tapered shape, the etching proceeds along the side surfaces 138 of the tungsten wiring portions 136 upon forming the through holes 171. As a result, a space X is formed next to the side surfaces 138 of the tungsten wiring portions 136 as shown in FIG. 13(A). When the titanium nitride film 182 is formed, the space X may not be filled with the titanium nitride film 182, thereby remaining as a space Y as shown in FIG. 13(B). Accordingly, a gas or chemical remaining in the space Y may deteriorate the tungsten wiring portions 136.

Further, when the tungsten wiring portions 136 have the section with the forward tapered shape, a contact area of the tungsten wiring portions 136 with respect to the titanium nitride film 18 thereabove decreases. As a result, a resistivity of the tungsten wiring portions 136 in the through holes 171 increases, thereby deteriorating a performance of the semiconductor device.

In view of the problems described above, an object of the present invention is to provide and a method of producing a semiconductor device capable of solving the problems of the conventional method of producing the semiconductor device. In the method of producing a semiconductor device, it is possible to obtain a tungsten wiring portion with a preferable sectional shape. Accordingly, it is possible to prevent a resistance of the tungsten wiring portion from increasing, and to prevent reliability of the wiring portion from decreasing.

Further objects and advantages of the invention will be apparent from the following description of the invention.

SUMMARY OF THE INVENTION

In order to attain the objects described above, according to the present invention, a method of producing a semiconductor device includes the steps of:

preparing a base member;

laminating sequentially a barrier film formed of titanium nitride, a wiring portion film formed of tungsten, and a mask film formed of titanium nitride on the base member to form a multi-layer film;

forming a resist mask on the mask film so that the resist mask covers a wiring portion forming area and exposes a wiring portion non-forming area;

etching the mask film using a first gas in which titanium nitride has a large etching ratio with respect to tungsten so that a portion of the mask film in the wiring portion forming area is removed and a portion of the mask film in the wiring portion non-forming area remains; and etching the wiring portion film using a second gas in which tungsten has a large etching ratio with respect to titanium nitride so that a portion of the wiring portion film in the wiring portion non-forming area is removed and a portion of the wiring portion film in the wiring portion forming area remains.

In the method of producing the semiconductor device of the present invention, the mask film formed of titanium nitride is formed on the wiring portion film formed of tungsten. The wiring portion film formed of tungsten is etched using the second gas in which tungsten has a large etching ratio with respect to titanium nitride.

Accordingly, when the wiring portion film formed of tungsten is etched, it is possible to use the mask film formed of titanium nitride as an etching mask even when a width of the resist mask decreases or the resist mask disappears. As a result, it is possible to obtain a tungsten wiring portion with a preferable sectional shape. Accordingly, it is possible to prevent a resistance of a wiring portion from increasing, and to prevent reliability of the wiring portion from decreasing.

BRIEF DESCRIPTION OF THE DRAWINGS

FIGS. 6(A) to 6(D) are electron micrographs showing the semiconductor device formed with various bias powers according to the embodiment of the present invention, wherein FIG. 6(A) is an electron micrograph of the semiconductor device formed with a bias power of 20 W, FIG. 6(B) is an electron micrograph of the semiconductor device formed with a bias power of 30 W, FIG. 6(C) is an electron micrograph of the semiconductor device formed with a bias power of 40 W, and FIG. 6(D) is an electron micrograph of the semiconductor device formed with a bias power of 50 W;

FIGS. 9(A) to 9(E) are electron micrographs showing the semiconductor device formed with various flowing ratios of $CHF_3$ and $CF_4$ according to the embodiment of the present invention, wherein FIG. 9(A) is an electron micrograph of the semiconductor device formed with a flowing ratio of $CHF_3$ and $CF_4$ at 25/125 (17%), FIG. 9(B) is an electron micrograph of the semiconductor device formed with a flowing ratio of $CHF_3$ and $CF_4$ at 50/100 (33%), FIG. 9(C) is an electron micrograph of the semiconductor device formed with a flowing ratio of $CHF_3$ and $CF_4$ at 75/75 (50%), FIG. 9(D) is an electron micrograph of the semiconductor device formed with a flowing ratio of $CHF_3$ and $CF_4$ at 100/50 (67%), and FIG. 9(E) is an electron micrograph of the semiconductor device formed with a flowing ratio of $CHF_3$ and $CF_4$ at 125/25 (83%);

FIGS. 11(A) to 11(C) are schematic sectional views showing a conventional method of producing a semiconductor device;

FIGS. 12(A) to 12(C) are schematic sectional views showing the conventional method of producing the semiconductor device.

DETAILED DESCRIPTION OF PREFERRED EMBODIMENTS

Figure 1:
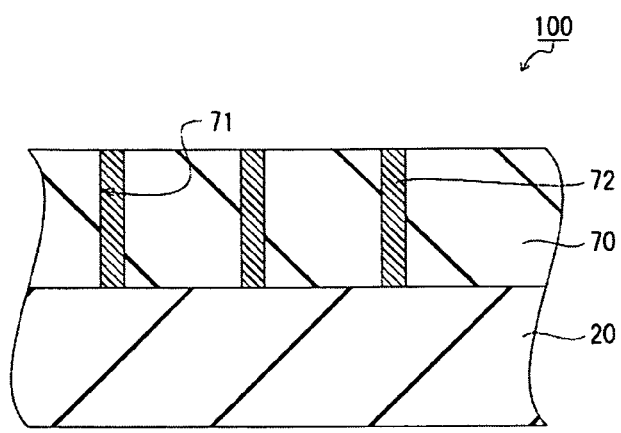
FIGS. 1(A) and 1(B) are schematic sectional views No. 1 showing a method of producing a semiconductor device according to an embodiment of the present invention.
Figure 1:
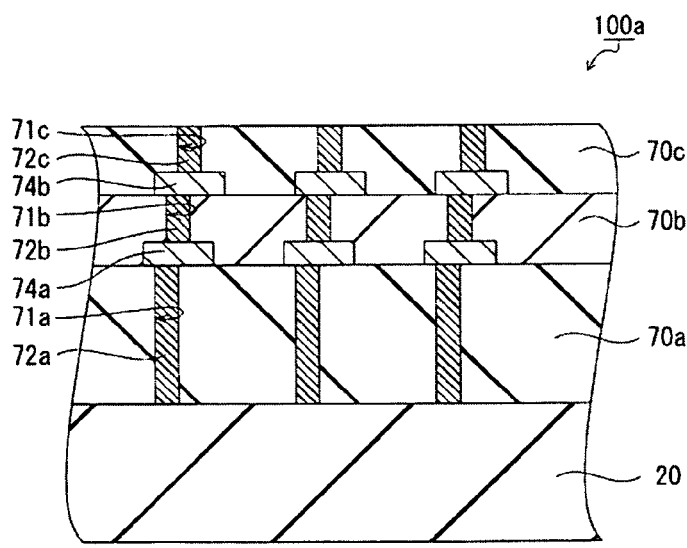
Figure 2:
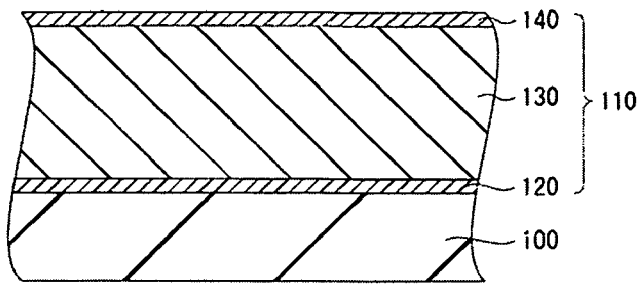
FIGS. 2(A) to 2(C) are schematic sectional views No. 2 showing the method of producing the semiconductor device according to the embodiment of the present invention.
Figure 2:
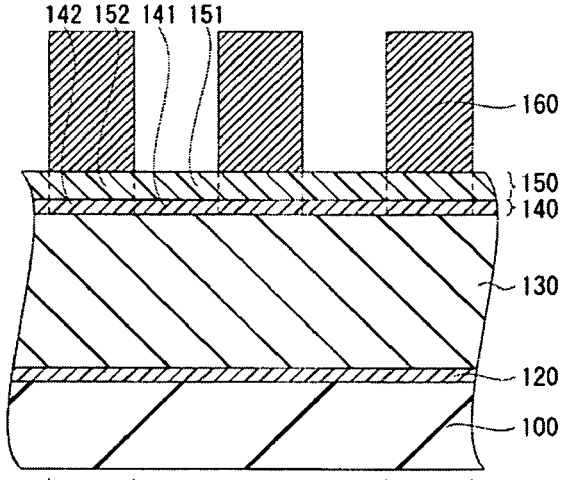
Figure 2:
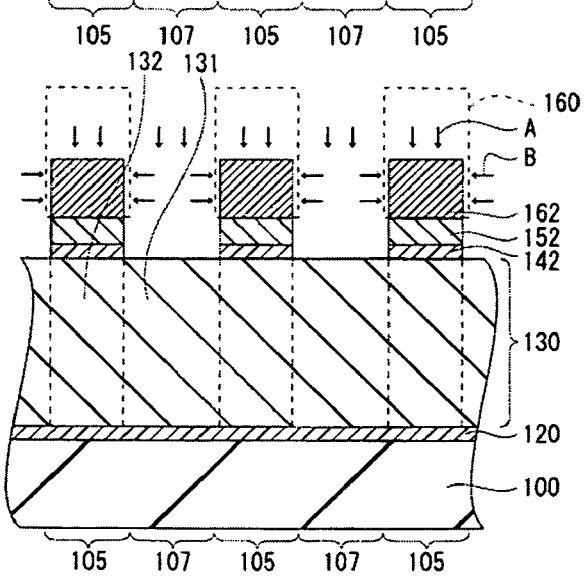
Figure 3:
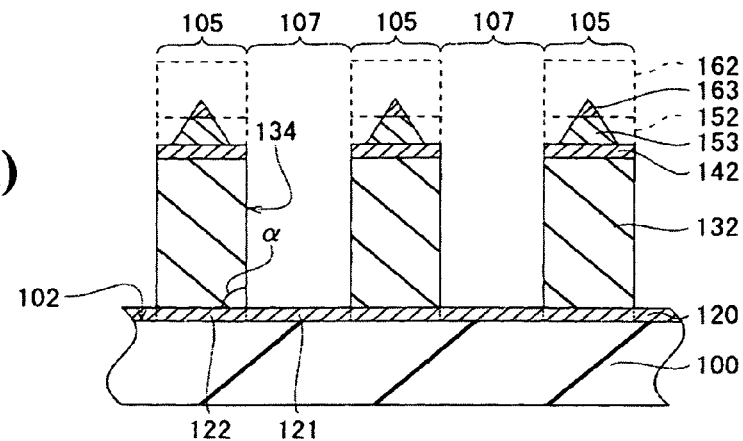
FIGS. 3(A) to 3(C) are schematic sectional views No. 3 showing the method of producing the semiconductor device according to the embodiment of the present invention.
Figure 3:
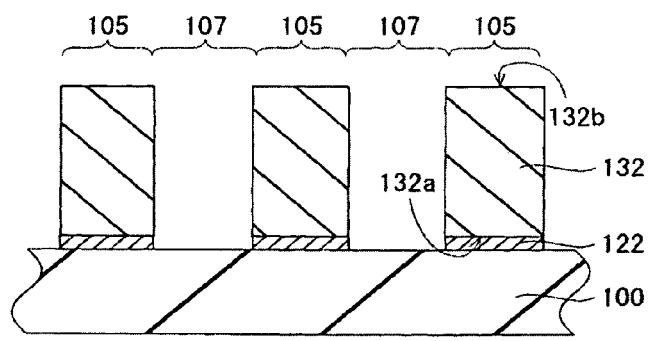
Figure 3:
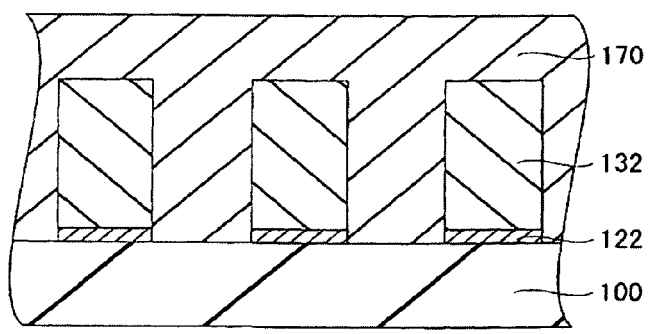
Figure 4:
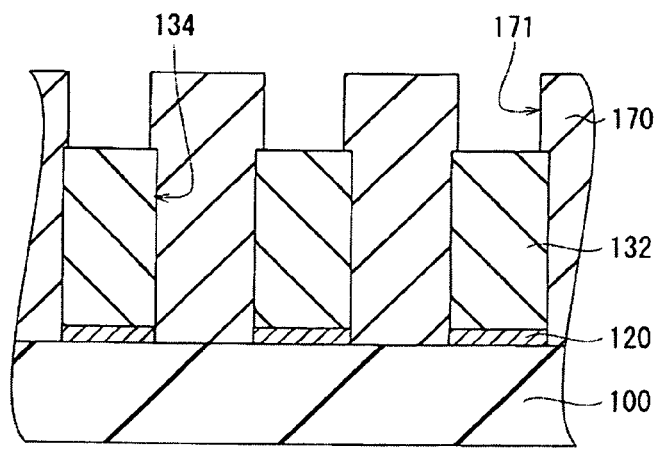
FIGS. 4(A) and 4(B) are schematic sectional views No. 4 showing the method of producing the semiconductor device according to the embodiment of the present invention.
Figure 4:
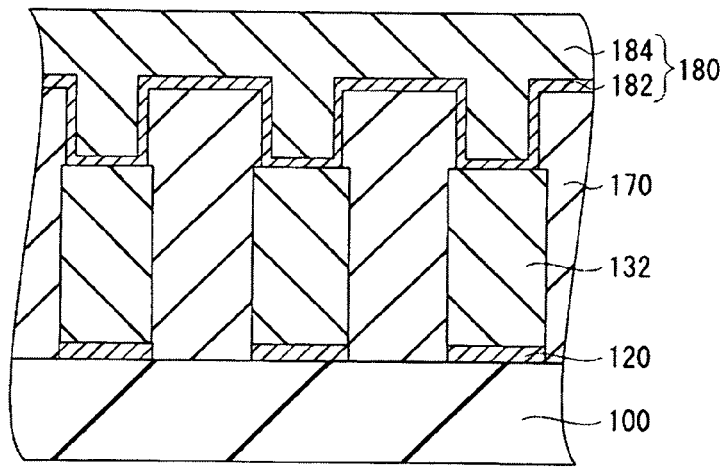

Hereunder, embodiments of the present invention will be explained with reference to the accompanying drawings. In the following description of the present invention, each of the drawings is illustrated schematically in terms of a shape, a size, and a dimensional relationship for explaining the embodiments of the present invention, and the present invention is not limited to the shape, the size, and the dimensional relationship shown in the drawings.

A method of producing a semiconductor device will be explained with reference to FIGS. 1(A) and 1(B) to 4(A) and 4(B).

FIGS. 1(A) and 1(B) are schematic sectional views No. 1 showing the method of producing the semiconductor device according to an embodiment of the present invention. FIGS. 2(A) to 2(C) are schematic sectional views No. 2 showing the method of producing the semiconductor device according to the embodiment of the present invention. FIGS. 3(A) to 3(C) are schematic sectional views No. 3 showing the method of producing the semiconductor device according to the embodiment of the present invention. FIGS. 4(A) and 4(B) are schematic sectional views No. 4 showing the method of producing the semiconductor device according to the embodiment of the present invention.

First, a base member 100 is prepared. The base member 100 is formed of a semiconductor substrate 20 having an element such as a transistor formed thereon and an interlayer insulation film 70 formed on the semiconductor substrate 20. In the accompanying drawings, the element is not shown.

As shown in FIG. 1(A), conductive plugs 72 are formed in the interlayer insulation film 70 for electrically connecting the element formed in the semiconductor substrate 20 to a wiring portion formed in a later step. Through holes 71 formed in the interlayer insulation film 70 are filled with, for example, tungsten, to form the conductive plugs 72.

In the embodiment, the semiconductor substrate 20 may be formed of a multi-layer wiring portion structure. As an example of the multi-layer wiring portion structure, a two-layer wiring structure will be explained next.

As shown in FIG. 1(B), in a base member 100a, a first interlayer insulation film 70a, a second interlayer insulation film 70b, and a third interlayer insulation film 70c are sequentially laminated on the semiconductor substrate 20. Similar to the configuration shown in FIG. 1(A), the semiconductor substrate 20 includes an element (not shown).

A first wiring pattern 74a is formed on the first interlayer insulation film 70a, and a second wiring pattern 74b is formed on the second interlayer insulation film 70b. First conductive plugs 72a are formed in the first interlayer insulation film 70a for electrically connecting the element formed in the semiconductor substrate 20 to the first wiring pattern 74a. Through holes 71a formed in the first interlayer insulation film 70a are filled with, for example, tungsten, to form the first conductive plugs 72a.

Second conductive plugs 72b are formed in the second interlayer insulation film 70b for electrically connecting the first wiring pattern 74a to the second wiring pattern 74b. Through holes 71b formed in the second interlayer insulation film 70b are filled with, for example, tungsten, to form the second conductive plugs 72b.

Third conductive plugs 72c are formed in the third interlayer insulation film 70c for electrically connecting the second wiring pattern 74b to a wiring portion formed in a later step. Through holes 71c formed in the third interlayer insulation film 70c are filled with, for example, tungsten, to form the third conductive plugs 72c.

In the next step, as shown in FIG. 2(A), a barrier film 120, a wiring portion film 130, and a mask film 140 are sequentially formed on the base member 100, thereby forming a multi-layer film 110 formed of the barrier film 120, the wiring portion film 130, and the mask film 140.

In the embodiment, the barrier film 120 may be formed of a titanium nitride film formed with a well-known sputter method, and may have a thickness of about 50 nm. The wiring portion film 130 may be formed of a tungsten film formed with a well-known CVD method, and may have a thickness of about 300 to 400 nm. The mask film 140 may be formed of a titanium nitride film formed with a well-known sputter method, and may have a thickness of about 50 nm.

In the next step, an anti-reflection film 150 is coated on the mask film 140. The anti-reflection film 150 is formed of a well-known organic resin material, and contains a pigment for absorbing light having an exposure wave length of lithography.

In the next step, as shown in FIG. 2(B), a resist is coated on the anti-reflection film 150 to form a resist film. The resist film is patterned through photolithography to form resist masks 160. The resist masks 160 cover wiring portion forming areas 105 such that wiring portion non-forming areas 107 are exposed. Accordingly, exposed portions 151 of the anti-reflection film 150 are exposed from the resist masks 160. The wiring portion forming areas 105 and the wiring portion non-forming areas 107 are defined as desirable areas according to a design when the resist film is exposed.

When the semiconductor device has a fine wiring portion structure having a wiring pattern with a width of less than 150 nm, a KrF excimer laser or an ArF excimer laser is used as a stepper. In this case, a KrF type resist or an ArF type resist are used. It is preferred that the resist masks 160 have a thickness of at most about 300 nm considering a dimensional conversion difference.

In the next step, the anti-reflection film 150 is patterned through etching using the resist masks 160. In patterning the anti-reflection film 150, the exposed portions 151 of the anti-reflection film 150 in the wiring portion non-forming areas 107 are removed, so that etching remaining portions 152 of the anti-reflection film 150 remain in the wiring portion forming areas 105. In the following description, the etching remaining portions 152 of the anti-reflection film 150 may simply referred to as anti-reflection films 152.

In patterning the anti-reflection film 150, RIE (Reactive Ion Etching) is preformed using a fluorine type gas mainly containing $CHF_3$ as an etching gas. The fluorine type gas mainly containing $CHF_3$ may be, for example, a mixed gas of $CF_3$, $CHF_3$, $Cl_2$, and Ar to be supplied at flow rates of 20 sccm (standard cubic cm per minute), 130, sccm, 50 sccm, and 200 sccm, respectively.

In the next step, the mask film 140 is patterned through etching using the resist masks 160 and the anti-reflection films 152 as masks. In patterning the mask film 140, exposed portions 141 of the mask film 140 in the wiring portion non-forming areas 107 are removed, so that etching remaining portions 142 of the mask film 140 remain in the wiring portion forming areas 105. In the following description, the etching remaining portions 142 of the mask film 140 may simply referred to as mask films 142.

In patterning the mask film 140, the RIE is preformed using a first gas such as, for example, a chlorine type gas containing $Cl_2$ as an etching gas. The first gas, for example, $Cl_2$ gas, has a large etching ratio of titanium nitride with respect to tungsten, and is supplied at flow rates of 200 sccm.

Note that it is known that a KrF type resist or an ArF type resist has poor plasma resistance. Accordingly, the resist mask 160 is etched not only in a vertical direction (an arrow direction A in FIG. 2(C)) but also in a horizontal direction (an arrow direction B in FIG. 2(C)).

In the embodiment, the anti-reflection film 150 and the mask film 140 are etched in a short period of time. Accordingly, the resist mask 160 is etched in the horizontal direction to a minimum extent. Etching remaining portions 162 of the resist masks 160 remain in the wiring portion forming areas 105. In the following description, the etching remaining portions 162 of the resist masks 160 may simply referred to as resist masks 162.

In the next step, the wiring portion film 130 is patterned through etching using the resist masks 162, the anti-reflection films 152, and the mask films 142 as masks. In patterning the wiring portion film 130, exposed portions 131 of the wiring portion film 130 in the wiring portion non-forming areas 107 are removed, so that etching remaining portions 132 of the wiring portion film 130 remain in the wiring portion forming areas 105, thereby forming tungsten wiring portions 132 or wiring portions 132. As a result, exposed portions 121 of the barrier film 120 in the wiring portion non-forming areas 107 are exposed as shown in FIG. 3(A).

In patterning the wiring portion film 130, the RIE is preformed using a second gas such as, for example, a fluorine type gas containing $SF_6$ as an etching gas. The second gas has a large etching ratio of tungsten with respect to titanium nitride. The fluorine type gas mainly containing $CHF_3$ may be, for example, a mixed gas of $CF_3$, $CHF_3$, $Cl_2$, and Ar to be supplied at flow rates of 20 sccm (standard cubic cm per minute), 180, sccm, 80 sccm, and 120 sccm, respectively. Note that over etching is performed to completely remove portions 131 of the wiring portion film 130 in the wiring portion non-forming areas 107 not covered with the resist masks 162 of the resist masks 160.

In the embodiment, an etching ratio of tungsten with respect to the resist is about 2.0. Accordingly, when the wiring portion film 130 is formed of a tungsten film, the resist masks 162 are etched in the vertical direction while the wiring portion film 130 is etched. Further, when the resist masks 162 are formed of a KrF type resist or an ArF type resist, the resist masks 162 have poor plasma resistance, so that the resist masks 162 are etched in the horizontal direction as well.

As a result, when the wiring portion film 130 is etched, the resist masks 162 and the anti-reflection films 152 are etched in the horizontal direction and the vertical direction. Accordingly, the resist masks 162 and the anti-reflection films 152 have a section having a triangular shape, or completely disappear. As shown in FIG. 3(A), etching remaining portions 163 of the resist masks 162 and etching remaining portions 153 of the anti-reflection films 152 remain. In the following description, the etching remaining portions 163 of the resist masks 162 may simply referred to as resist masks 163, and the etching remaining portions 153 of the anti-reflection films 152 may simply referred to as anti-reflection films 153.

As described above, the second gas has a large etching ratio of tungsten with respect to titanium nitride, so that the mask films 142 are not etched to a large extent. Accordingly, even when the resist masks 153 and the anti-reflection films 153 disappear, the mask films 142 remain as masks. As a result, it is possible to obtain the tungsten wiring portions 132 with an appropriate sectional shape.

Accordingly, as shown in FIG. 3(A), the tungsten wiring portions 132 have side surfaces 134 inclined by an angle α larger than 85 degrees with respect to an upper surface 102 of the base member 100. Further, the tungsten wiring portions 132 have an appropriate sectional shape, i.e., a substantially rectangular shape, not a forward tapered shape.

In the next step, as shown in FIG. 3(B), the etching remaining portions 142 on the tungsten wiring portions 132 and the exposed portions 121 of the barrier film 120 in the wiring portion non-forming areas 107 are removed through etching. At this time, the etching remaining portions 122 of the barrier film 120 remain in the wiring portion forming areas 105.

In etching the etching remaining portions 142 and the exposed portions 121, similar to the step of patterning the mask film 140, the RIE is performed using a chlorine type gas containing $Cl_2$ as an etching gas. At this time, tungsten has a large etching ratio with respect to titanium nitride, so that the tungsten wiring portions 132 are not etched to a large extent. When the resist masks 163 and the anti-reflection films 153 remain on the etching remaining portions 142 of the mask film 140, the resist masks 163 and the anti-reflection films 153 may be removed through ashing before etching the barrier film 120.

In the next step, as shown in FIG. 3(C), an interlayer insulation film 170 is formed on the base member 100, so that the tungsten wiring portions 132 are embedded in the interlayer insulation film 170. In the embodiment, the interlayer insulation film 170 may be formed through depositing an NSG film with a CVD method.

In the next step, as shown in FIG. 4(A), through holes 171 are formed in the interlayer insulation film 170 on the wiring portions 136 through well-known photolithography and dry etching. As described above, the wiring portions 132 have an appropriate sectional shape, i.e., a substantially rectangular shape. Accordingly, when the interlayer insulation film 170 is etched to form the through holes 171, the side surfaces 134 of the wiring portions 132 are not etched to a large extent. As a result, when the interlayer insulation film 170 is etched to form the through holes 171, it is possible to prevent a space from forming in the side surfaces 134 of the wiring portions 132.

In the next step, as shown in FIG. 4(B), a titanium nitride (TiN) film 182 and a metal film 184 are sequentially formed with a CVD method or a puttering method, so that the through holes 171 are filled with the titanium nitride film 182 and the metal film 184. Afterward, the titanium nitride film 182 and the metal film 184 are patterned to obtain an upper layer wiring portion.

In the embodiment, the titanium nitride film 182 and the metal film 184 filling the through holes 171 are referred to as an upper layer metal wiring portion 180. The upper layer metal wiring portion 180 is electrically connected to the tungsten wiring portions 132 or lower layer wiring portions.

As described above, in the embodiment, when the interlayer insulation film 170 is etched to form the through holes 171, it is possible to prevent a space from forming in the side surfaces 134 of the wiring portions 132. Accordingly, as opposed to a conventional method of producing a semiconductor device, it is possible to prevent a void or space from forming. As a result, it is possible to prevent the tungsten wiring portions 132 from deteriorating due to a gas or chemical remaining in the void or space.

Further, in the embodiment, the tungsten wiring portions 132 have a substantially rectangular sectional shape, thereby preventing a sectional area of the tungsten wiring portions 132 from decreasing. Accordingly, it is possible to prevent a wiring resistance of the tungsten wiring portions 132 from increasing. At the same time, it is possible to prevent a contact area between the tungsten wiring portions 132 and the upper layer metal wiring portion 180 from decreasing, thereby preventing a resistance in the through holes 171 from increasing.

In the embodiment, it is necessary to maintain the resist mask only until the mask film 140 is completely etched. Accordingly, it is possible to reduce a thickness of the resist mask to a minimum level. As a result, it is possible to reduce a variance in a dimension and a cost of the semiconductor device.

In the embodiment, when the resist mask has a small thickness, it is not necessary to reduce a thickness of the tungsten film. Accordingly, it is possible to prevent a wiring resistance from increasing when the wiring film has a small thickness.

In general, tungsten has poor adhesion with respect to a silicon nitride film. Accordingly, every time when a film is formed, etching is performed, or cleaning is performed, a tungsten film may fall off from a silicon nitride film. On the other hand, tungsten has good adhesion with respect to a titanium nitride film. Accordingly, when a wiring portion is etched, a titanium nitride film functioning as a mask film remains in an appropriate shape.

Further, when a silicon nitride film remains on tungsten, a remaining portion thereof may cause poor contact with an upper layer wiring portion. On the other hand, a titanium nitride film has conductivity. Accordingly, even when a titanium nitride film remains on tungsten, a remaining portion thereof does not cause poor contact with an upper layer wiring portion.

When an ECR etching device (a product of Hitachi; model No. M632A), for example, is used as an etching device, a resist mask may disappear at a high bias power. Accordingly, a bias power of 20 W is applied normally.

On the other hand, in the embodiment, even when the resist mask is removed to a large extent upon etching the anti-reflection film, the mask film functions as the etching mask upon etching the wiring portion film in the later step. Accordingly, it is possible to increase a bias power. When a bias power increases, anisotropy of etching increases. That is, a ratio of etching in a horizontal direction decreases with respect to etching in a vertical direction.

Figure 5:
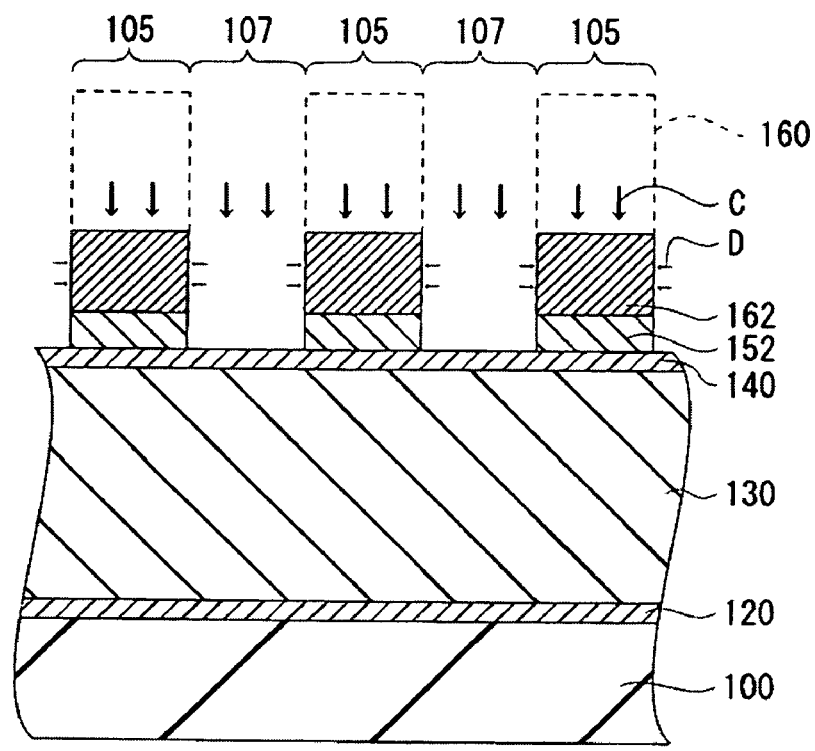
FIG. 5 is a schematic sectional view No. 5 showing the method of producing the semiconductor device according to the embodiment of the present invention.

A step of etching the anti-reflection film at an increased bias power will be explained with reference to FIG. 5. FIG. 5 is a schematic sectional view No. 5 showing the method of producing the semiconductor device according to the embodiment of the present invention.

In the step shown in FIG. 5, steps are similar to those shown in FIGS. 1(A) and 1(B) to 4(A) and 4(B), except the step of etching the anti-reflection film. When the anti-reflection film is etched at an increased bias power, a ratio of etching in a horizontal direction (indicated as an arrow direction D in FIG. 5) decreases with respect to etching in a vertical direction (indicated as an arrow direction C in FIG. 5).

A relationship between the bias power and a finished dimension will be explained with reference to FIGS. 6(A) to 6(D) and FIG. 7.

FIGS. 6(A) to 6(D) are electron micrographs showing the semiconductor device formed with various bias powers according to the embodiment of the present invention. The electron micrographs shown in FIGS. 6(A) to 6(D) were taken at an acceleration voltage of 800 V with a dimension measurement device with a well-known scanning electron microscope after the patterning steps, the ashing step, and the cleaning step.

More specifically, FIG. 6(A) is an electron micrograph of the semiconductor device formed with a bias power of 20 W, FIG. 6(B) is an electron micrograph of the semiconductor device formed with a bias power of 30 W, FIG. 6(C) is an electron micrograph of the semiconductor device formed with a bias power of 40 W, and FIG. 6(D) is an electron micrograph of the semiconductor device formed with a bias power of 50 W.

Figure 6:
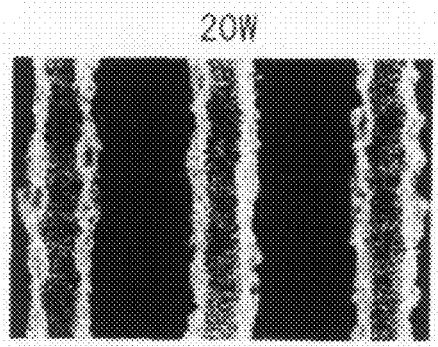
Figure 6:
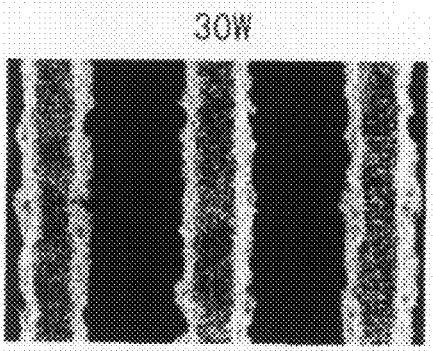
Figure 6:
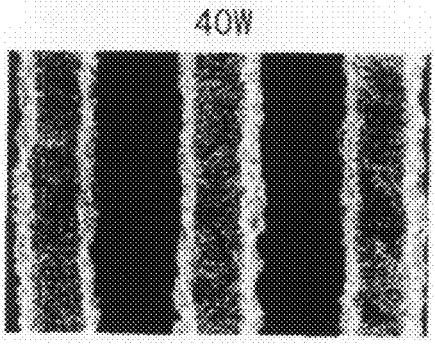
Figure 6:
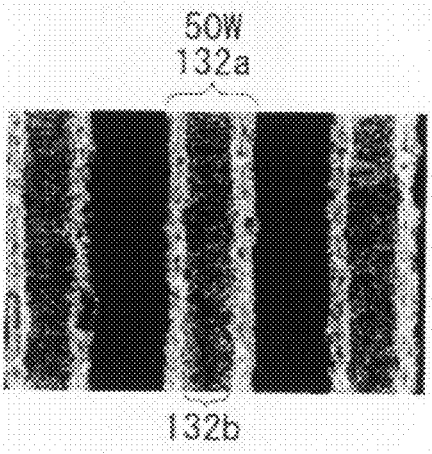
Figure 7:
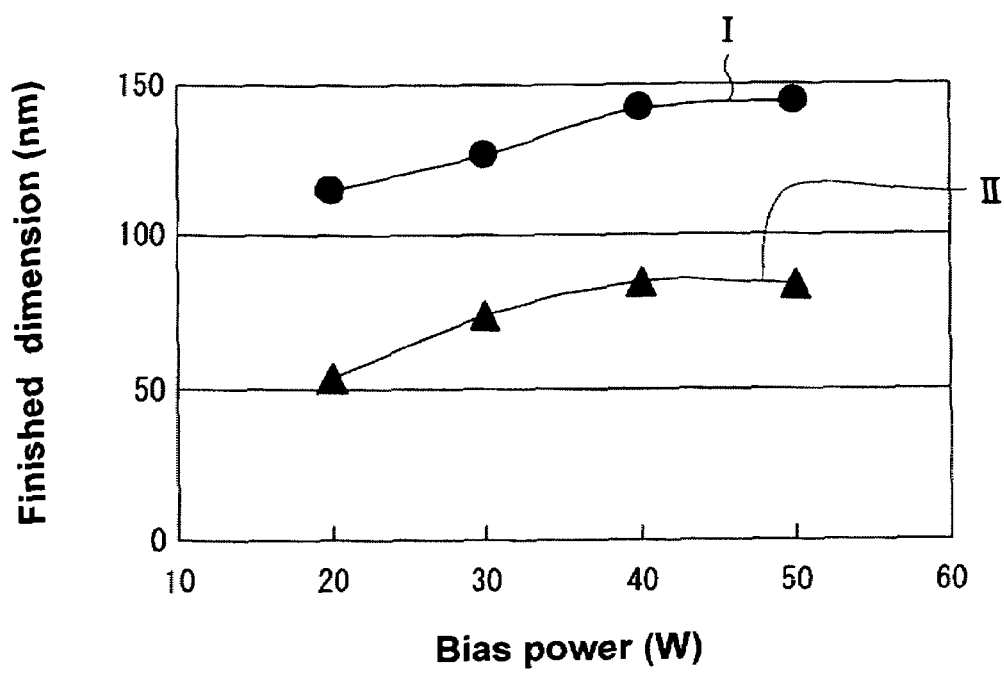
FIG. 7 is a graph showing a relationship between the bias power and a finished dimension according to the embodiment of the present invention.

FIG. 7 is a graph showing the relationship between the bias power and the finished dimension according to the embodiment of the present invention. Similar to the electron micrographs shown in FIGS. 6(A) to 6(D), the finished dimension was measured after the patterning steps, the ashing step, and the cleaning step. In FIG. 7, a horizontal axis represents the bias power (unit: W), and a vertical axis represents a width of a wiring pattern as the finished dimension (unit: nm) after the patterning steps. A line I represents a wiring pattern width of a bottom portion 132a (bottom dimension), and a line II represents a wiring pattern width of a top portion 132b (top dimension).

As shown in FIG. 7, when the bias power increases, the top dimension and the bottom dimension increase. In the top dimension, when an RF output was 20 W, the width was about 50 nm. When the RF output was 30 W, the width increased to about 75 nm. When the RF output was 40 to 50 W, the width increased to about 85 nm. In the bottom dimension, when an RF output was 20 W, the width was about 110 nm. When the RF output was 30 W, the width increased to about 130 nm. When the RF output was 40 to 50 W, the width increased to about 140 nm.

According to the result shown in FIG. 7, it is preferred that the bias power is set larger than 20 W, that is a normal condition in the conventional method, upon etching the anti-reflection film. When the bias power becomes larger than 50 W, the resist may completely disappear upon etching the anti-reflection film. Accordingly, it is preferred that the bias power is set between 30 W and 50 W upon etching the anti-reflection film.

Figure 8:
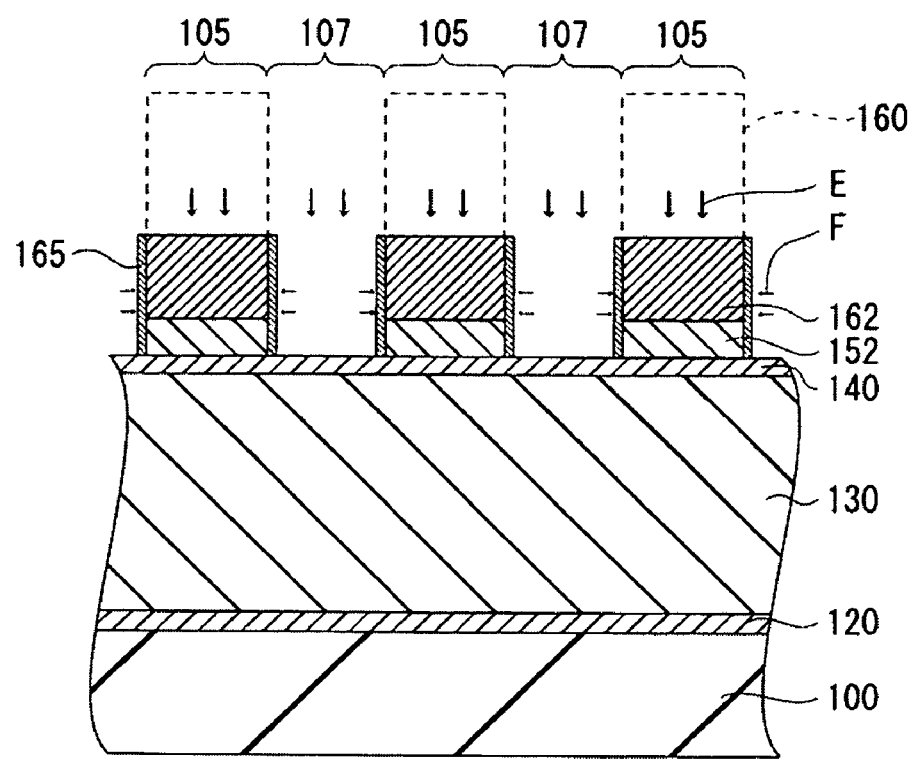
FIG. 8 is a schematic sectional view No. 6 showing the method of producing the semiconductor device according to the embodiment of the present invention.

A step of etching the anti-reflection film while supplying $CHF_3$ at various amounts will be explained next. FIG. 8 is a schematic sectional view No. 6 showing the method of producing the semiconductor device according to the embodiment of the present invention.

In the step shown in FIG. 8, steps are similar to those shown in FIGS. 1(A) and 1(B) to 4(A) and 4(B), except the step of etching the anti-reflection film.

When a flowing amount of $CHF_3$ increases upon etching the anti-reflection film, $CHF_3$ reacts with carbon in the anti-reflection film or the resist mask, so that a sidewall protective film is formed on a side surface of the resist mask. Accordingly, as shown in FIG. 8, when a flowing ratio of $CHF_3$ with respect to $CF_4$ increases, sidewall protective films are formed on side surfaces of the resist masks. As a result, it is possible to reduce an influence of etching in a horizontal direction (an arrow direction F in FIG. 8) of the resist mask during etching.

A relationship between the flowing amount of $CHF_3$ and a dimension after etching will be explained with reference to FIGS. 9(A) to 9(E) and FIG. 10.

FIGS. 9(A) to 9(E) are electron micrographs showing the semiconductor device formed with various flowing ratios of $CHF_3$ and $CF_4$ under conditions similar to those in FIG. 6 according to the embodiment of the present invention. A total flowing amount of $CF_4$ and $CHF_3$ was maintained at 150 sccm, and surface micrographs and wiring dimensions were obtained at the various flowing ratios of $CHF_3$ and $CF_4$. The bias power was maintained at 30 W.

Figure 9:
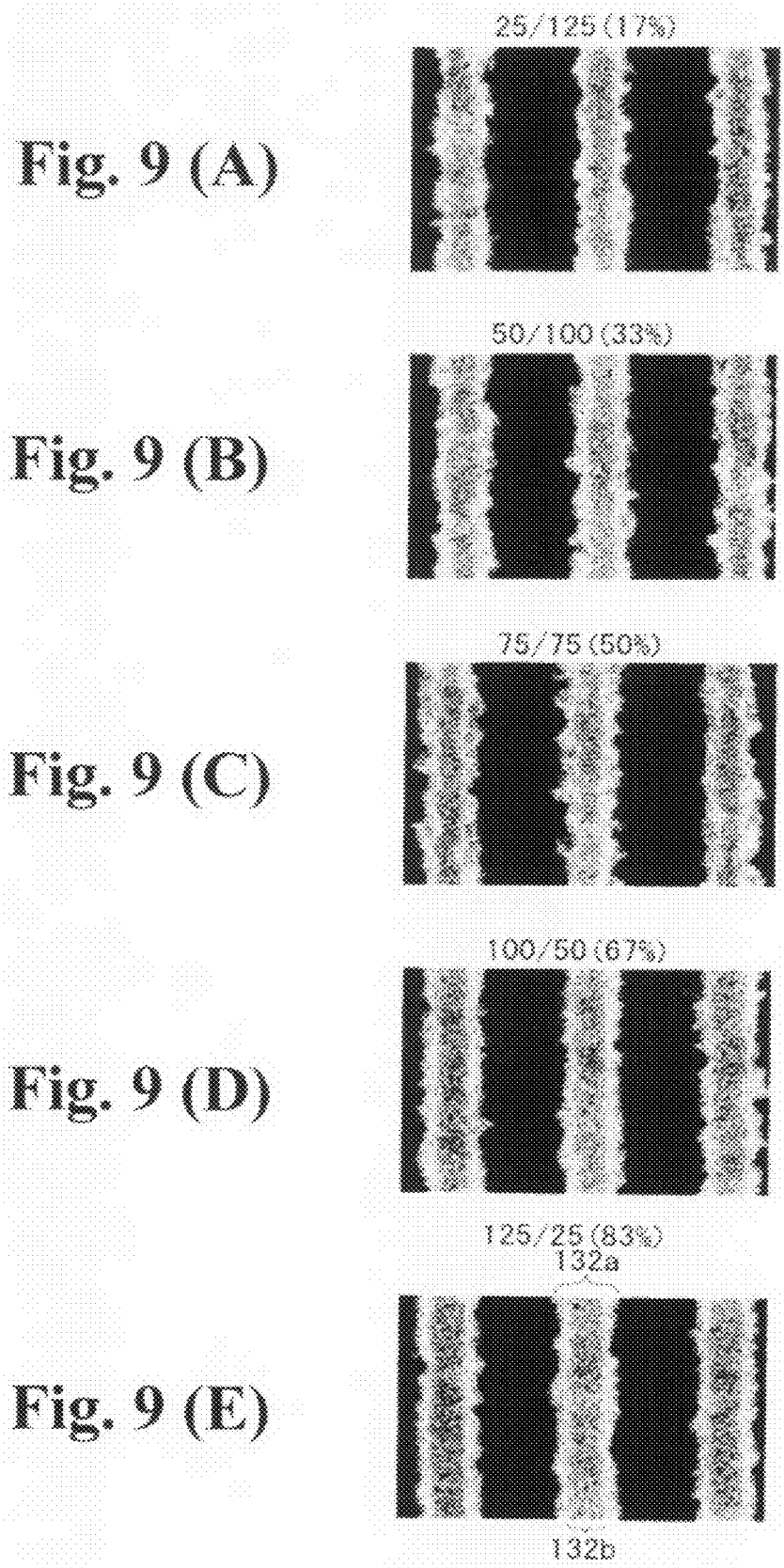

More specifically, FIG. 9(A) is an electron micrograph of the semiconductor device formed with a flowing ratio of $CHF_3$ and $CF_4$ at 25/125 (17%), FIG. 9(B) is an electron micrograph of the semiconductor device formed with a flowing ratio of $CHF_3$ and $CF_4$ at 50/100 (33%), FIG. 9(C) is an electron micrograph of the semiconductor device formed with a flowing ratio of $CHF_3$ and $CF_4$ at 75/75 (50%), FIG. 9(D) is an electron micrograph of the semiconductor device formed with a flowing ratio of $CHF_3$ and $CF_4$ at 100/50 (67%), and FIG. 9(E) is an electron micrograph of the semiconductor device formed with a flowing ratio of $CHF_3$ and $CF_4$ at 125/25 (83%). Percentages in parentheses represent the flowing ratios of $CHF_3$ with respect to the total flowing amount of $CF_4$ and $CHF_3$.

Figure 10:
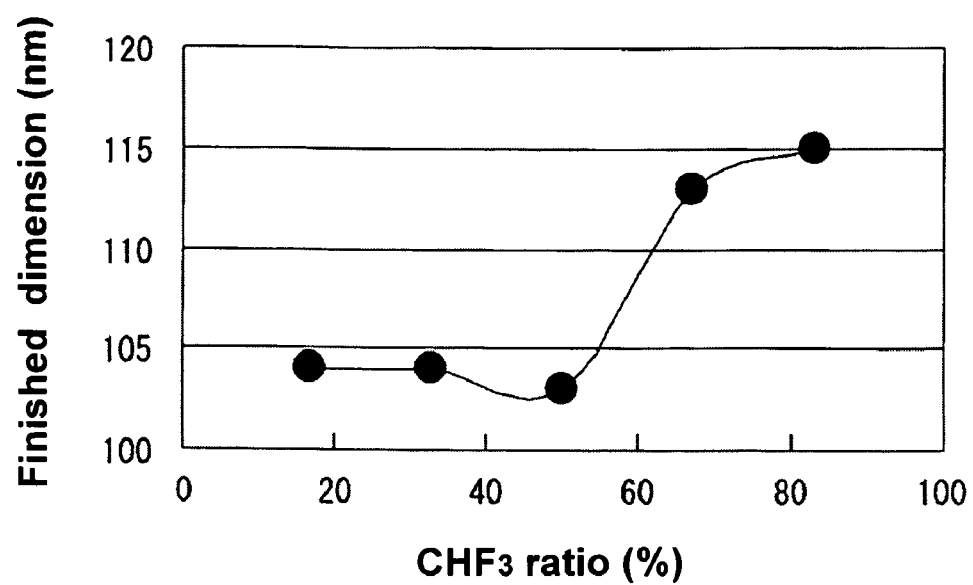
FIG. 10 is a graph showing a relationship between a flowing ratio of $CHF_3$ and a finished dimension according to the embodiment of the present invention.
Figure 13:
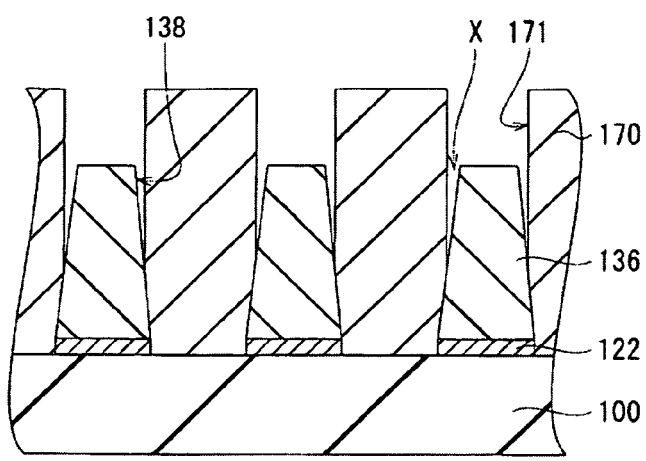
FIGS. 13(A) and 13(B) are schematic sectional views showing the conventional method of producing the semiconductor device.
Figure 13:
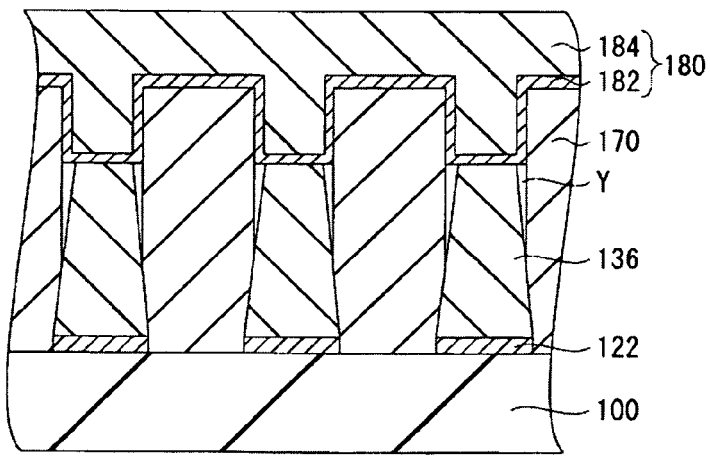

FIG. 10 is a graph showing the relationship between the flowing ratio of $CHF_3$ and the finished dimension according to the embodiment of the present invention.

As shown in FIG. 10, when the ratio of $CHF_3$ relative to $CF_4$ increases, the finished dimension increases. It is preferred that the flowing amount of $CHF_3$ is at least 125 sccm and the flowing amount of $CF_4$ is at most 25 sccm. Alternatively, the flowing amount of $CHF_3$ may be 150 sccm and $CF_4$ is not used. In other words, the flowing ratio of $CHF_3$ relative to $CF_4$ is preferably at lease more than six times.

In the embodiment, the conductive plugs are formed in the base member, and the present invention is not limited thereto. For example, an interlayer insulation film with a through hole may be prepared as a base member. In this case, after a TiN film is formed on the interlayer insulation film and an inner wall of the through hole, tungsten is formed on the interlayer insulation film. At the same time, tungsten fills the through hole.

The disclosure of Japanese Patent Application No. 2007-087145, filed on Mar. 29, 2007, is incorporated in the application by reference.

While the invention has been explained with reference to the specific embodiments of the invention, the explanation is illustrative and the invention is limited only by the appended claims.

What is claimed is:

1. A method of producing a semiconductor device, comprising the steps of:
   preparing a base member;
   laminating sequentially a barrier film formed of titanium nitride, a wiring portion film formed of tungsten, and a mask film formed of titanium nitride on the base member;
   forming a resist mask so that the resist mask covers a wiring portion forming area and exposes a wiring portion non-forming area;
   etching the mask film using a first gas in which titanium nitride has an etching rate larger than that of tungsten so that a first portion of the mask film in the wiring portion forming area is removed and a second portion of the mask film in the wiring portion non-forming area remains; and
   etching the wiring portion film using a second gas in which tungsten has an etching rate larger than that of titanium nitride so that a third portion of the wiring portion film in the wiring portion non-forming area is removed and a fourth portion of the wiring portion film in the wiring portion forming area remains to form a wiring portion.

2. The method according to claim 1, wherein, in the step of etching the mask film using the first gas, said first gas includes a chlorine type gas, and, in the step of the wiring portion film using the second gas, said second gas includes a fluorine type gas.

3. The method according to claim 1, wherein, in the step of etching the mask film using the first gas, said first gas includes a chlorine type gas containing $Cl_2$, and, in the step of the wiring portion film using the second gas, said second gas includes a fluorine type gas containing $SF_6$.

4. The method according to claim 1, further comprising the steps of removing a fifth portion of the resist mask remaining after the step of etching the wiring portion film, and removing the second portion and the barrier film in the wiring portion non-forming area on the wiring portion.

5. The method according to claim 4, wherein, in the step of removing the second portion and the barrier film in the wiring portion non-forming area, the second portion and the barrier film in the wiring portion non-forming area are etched using the first gas.

6. The method according to claim 1, further comprising the steps of forming an interlayer insulation film on the base member for embedding the wiring portion, forming a through hole in the interlayer insulation film for exposing the wiring portion, filling the through hole with a conductive member, and forming an upper layer wiring portion on the interlayer insulation film.

7. The method according to claim 1, further comprising the steps of forming an anti-reflection film on the mask film, coating resist on the anti-reflection film to form a resist film, etching the resist film to form the resist mask, etching the anti-reflection film using a fluorine type gas so that a sixth portion of the anti-reflection film in the wiring portion forming area is removed and a seventh portion of the anti-reflection film in the wiring portion non-forming area remains.

8. The method according to claim 7, wherein, in the step of etching the anti-reflection film using the fluorine type gas, said fluorine type gas contains $CHF_3$.

9. The method according to claim 7, wherein, in the step of etching the anti-reflection film using the fluorine type gas, said anti-reflection film is etched through reactive ion etching at a bias power of 30 to 50 W.

10. The method according to claim 7, wherein, in the step of etching the anti-reflection film using the fluorine type gas, said fluorine type gas contains $CHF_3$ and $CF_4$ at a flowing amount of $CHF_3$ at least six times larger than that of $CF_4$.

11. The method according to claim 7, further comprising the steps of removing a fifth portion of the resist mask and an eighth portion of the anti-reflection film remaining after the step of etching the wiring portion film, and removing the second portion and the barrier film in the wiring portion non-forming area on the wiring portion.

12. The method according to claim 11, wherein, in the step of removing the second portion and the barrier film in the wiring portion non-forming area, the second portion and the barrier film in the wiring portion non-forming area are etched using the first gas.

13. The method according to claim 7, further comprising the steps of forming an interlayer insulation film on the base member for embedding the wiring portion, forming a through hole in the interlayer insulation film for exposing the wiring portion, filling the through hole with a conductive member, and forming an upper layer wiring portion on the interlayer insulation film.

14. The method according to claim 1, wherein, in the step of etching the wiring portion film using the second gas, said wiring portion film is etched to form the wiring portion having a width at most 150 nm.

15. The method according to claim 1, wherein, in the step of etching the wiring portion film using the second gas, said wiring portion film is etched to form the wiring portion having a thickness at most 300 to 400 nm.

* * * * *